INVENTORS
ROBERT C. HEUNER, &
JULIUS LITUS, JR.
ATTORNEY

FIRST LEVEL
FULL INPUT/OUTPUT
WIRING

FIRST LEVEL
TWO INPUTS, ONE
OUTPUT.

INVENTORS
ROBERT C. HEUNER &
JULIUS LITUS, JR.
BY [signature]
ATTORNEY

SECOND LEVEL BONDING PAD CONNECTIONS-TWO INPUTS, ONE OUTPUT

INVENTOR
ROBERT C. HEUNER &
JULIUS LITUS, JR.
BY [signature]
ATTORNEY

INVENTOR
ROBERT C. HEUNER &
JULIUS LITUS JR.
BY [signature]
ATTORNEY

United States Patent Office 3,558,992
Patented Jan. 26, 1971

3,558,992

INTEGRATED CIRCUIT HAVING BONDING PADS OVER UNUSED ACTIVE AREA COMPONENTS

Robert C. Heuner, Bound Brook, and Julius Litus, Jr., Trenton, N.J., assignors to RCA Corporation, a corporation of Delaware Filed June 17, 1968, Ser. No. 737,760
Int. Cl. H01l *19/00*
U.S. Cl. 317—101 3 Claims

ABSTRACT OF THE DISCLOSURE

An integrated circuit having a fixed number of active and passive semiconductor elements formed in a substrate. The elements may be interconnected to provide various circuit functions, such that one or more elements are not utilized in each different interconnection arrangement. The area over the elements not utilized is employed to provide bonding pads or crossover connections, thus saving area on the substrate surface.

BACKGROUND OF THE INVENTION

This invention relates to the field of integrated circuits, and more particularly to arrangements for minimizing the surface area occupied by said circuits.

In the manufacture of monolithic integrated circuits, each circuit usually occupies a central area on a semiconductor substrate; a number of peripheral bonding pads are disposed around the central area which contains a plurality of active and passive semiconductor elements, semiconductor regions of selected elements being electrically connected to the peripheral bonding pads by means of a deposited metallic layer.

The bonding pads occupy a substantial percentage of the available substrate area. Since the area occupied by the bonding pads is not available for the formation of semiconductor elements, the total area occupied by the circuit is substantially greater than that occupied by its operating elements.

An object of the present invention is to provide an integrated circuit ararngement in which the total area occupied by the circuit is minimized.

SUMMARY

An integrated circuit comprising a substrate having regions of semiconductor material forming a number of semiconductor elements. Means are provided operatively interconnecting only a selected number of the semiconductor elements. A metallic layer overlies at least one unselected element, the metallic layer being electrically coupled to at least one selected element.

DETAILED DESCRIPTION

In the manufacture of integrated circuits, economic considerations demand that, especially for medium and large scale integrated circuit arrays, a number of semiconductor elements be provided in such a manner that they may be electrically interconnected to yield a variety of circuit functions.

Integrated circuits of this type are generally manufactured by diffusing a plurality of active and passive semiconductor elements into a (monolithic or dielectrically isolated) semiconductor wafer to provide a semiconductor element array. A metallic layer is then deposited on the wafer and etched, in accordance with any of a number of available interconnection patterns, to provide the desired circuit function.

Where a given semiconductor element array is to be employed for providing a large variety of possible circuit functions, most of the circuit functions will not utilize each and every semiconductor element. Heretofore, the space occupied by these unused elements has not been utilized, and has represented wasted semiconductor wafer area.

We have, as will hereinafter be described, developed a technique for utilizing this heretofore unused wafer area, while at the same time reducing the area occupied by peripheral bonding pads employed to make external connections to the integrated circuit.

Figures 1, 2, 3, 4:
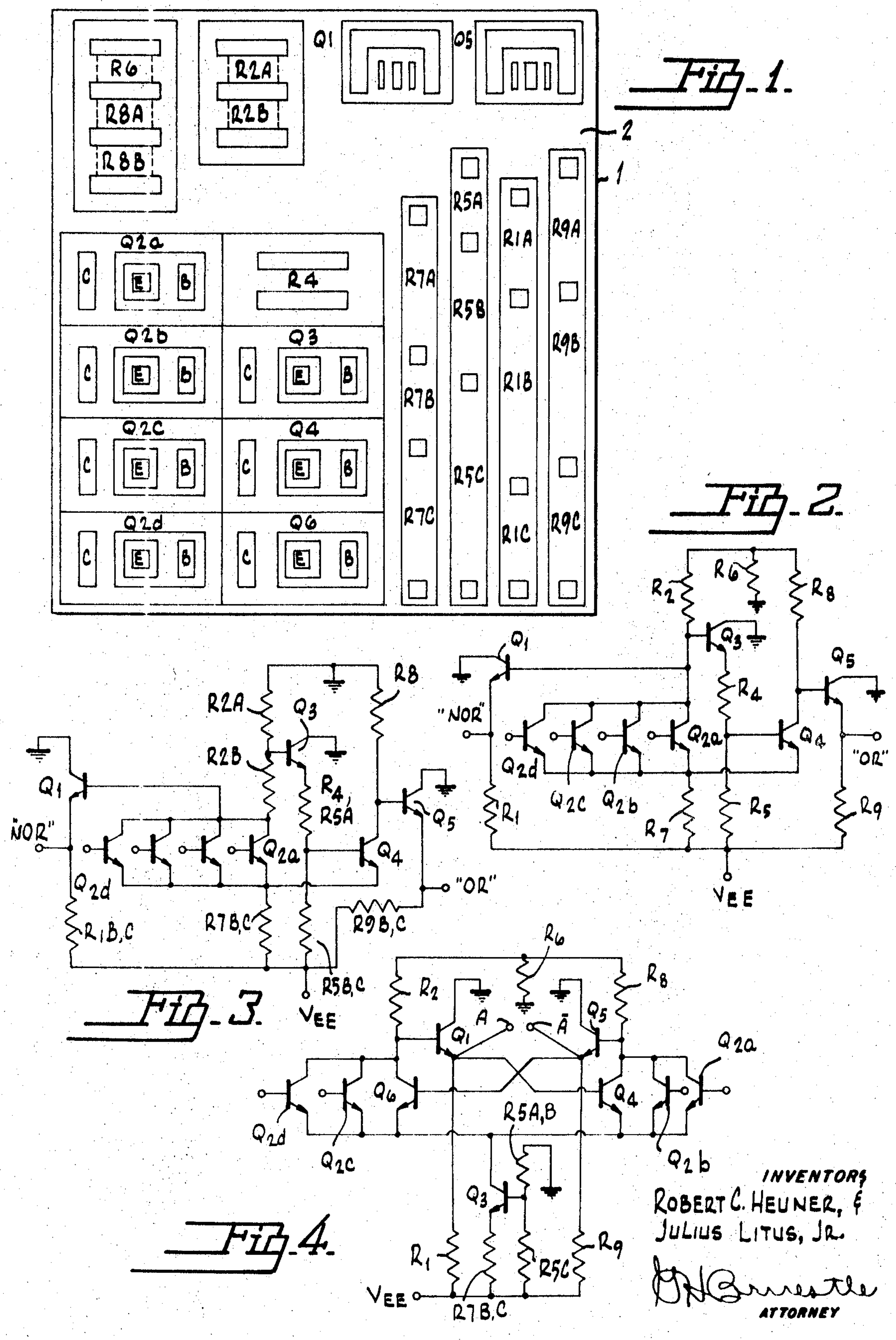
FIG. 1 shows a layout of semiconductor elements which may be utilized to provide an integrated circuit according to the invention.
FIGS. 2, 3 and 4 are schematic diagrams of various logic circuits which may be provided by suitably interconnecting the elements shown in FIG. 1.

FIG. 1 shows a typical semiconductor element array, in which a number of transistors and resistors are provided. The semiconductor element array 1 consists of a semiconductor substrate, preferably comprising silicon, in which nine transistors (designated by the prefix Q) and seven resistor regions (designated by the prefix R) have been formed by planar diffusion techniques. The resistor regions are each provided with a number of rectangular contact pads, so that a number of resistance values are obtainable from each diffused resistor area.

The transistors denoted as Q2*a* through Q2*d* are employed to provide input coupling to the array, and the transistors denoted as Q1 and Q5 are employed to provide output coupling therefrom.

Each transistor has rectangular emitter, base and collector contact areas denoted by the leters E, B and C, respectively.

The semiconductor element array 1 is covered with a silicon dioxide insulating layer 2. The insulating layer 2 has a plurality of holes therein to expose the various contact areas of the resistor and transistor elements.

The elements of the array 1 may be interconnected to provide (i) a logic gate exhibiting of 0.4 volt swing, (ii) a logic gate exhibiting a 0.8 volt swing, (iii) a 0.8 volt swing R-S (reset-set) flip-flop, (iv) a 0.4 volt swing R-S flipflops, or (v) a J-K steering circuit. For illustrative purposes, only the first three of these circuits will be discussed here.

FIG. 2 shows a schematic diagram for the 0.4 volt gate. The transistor Q2*a* through Q2*d* serve to couple input signals applied to the bases thereof to the rest of the circuit. The circuit may be operated with one, two, three or all four inputs applied to the input transistor bases. For many applications, only two inputs and one output are required.

The designations of the transistors and resistors in FIG. 2 correspond to those of the elements shown in FIG. 1. Transistors Q1 and Q5 serve as the output emitter followers for the gate circuit. Transistor Q1 produces an output when no signal is present at any of the input transistor bases. Transistor Q5 produces an output when a signal is present at any of the input transistor bases. The detailed operation of the circuits shown in FIGS. 2 to 4 will be readily understood by those skilled in the art, and need not be described here, as such a description is not necessary to an understanding of the invention.

FIG. 3 shows a schematic diagram for interconnection of the semiconductor elements of the array 1 to provide a 0.8 volt logic gate performing a similar logical function to that performed by the circuit of FIG. 2.

FIG. 4 shows a schematic diagram of the 0.4 volt R-S flip-flop, the circuit outputs being designated by the symbols A and $\overline{A}$, taken from the emitters of Q1 to Q5, respectively.

FIG. 2 indicates that when the 0.4 volt gate is operated with 4 inputs and 2 outputs, the transistor Q6 is not used. Similarly, with 2 inputs and 1 output, the transistors Q2*c*, Q2*d*, Q1 and Q6 are not used. For the 0.8 volt gate, the same transistors are unused for similar input and output configurations.

The above examples are illustrative. Where one output signal is desired, and it is to have the "NOR" polarity, Q5 rather than Q1 will be unused for the logic gate circuits.

Figures 5, 6:
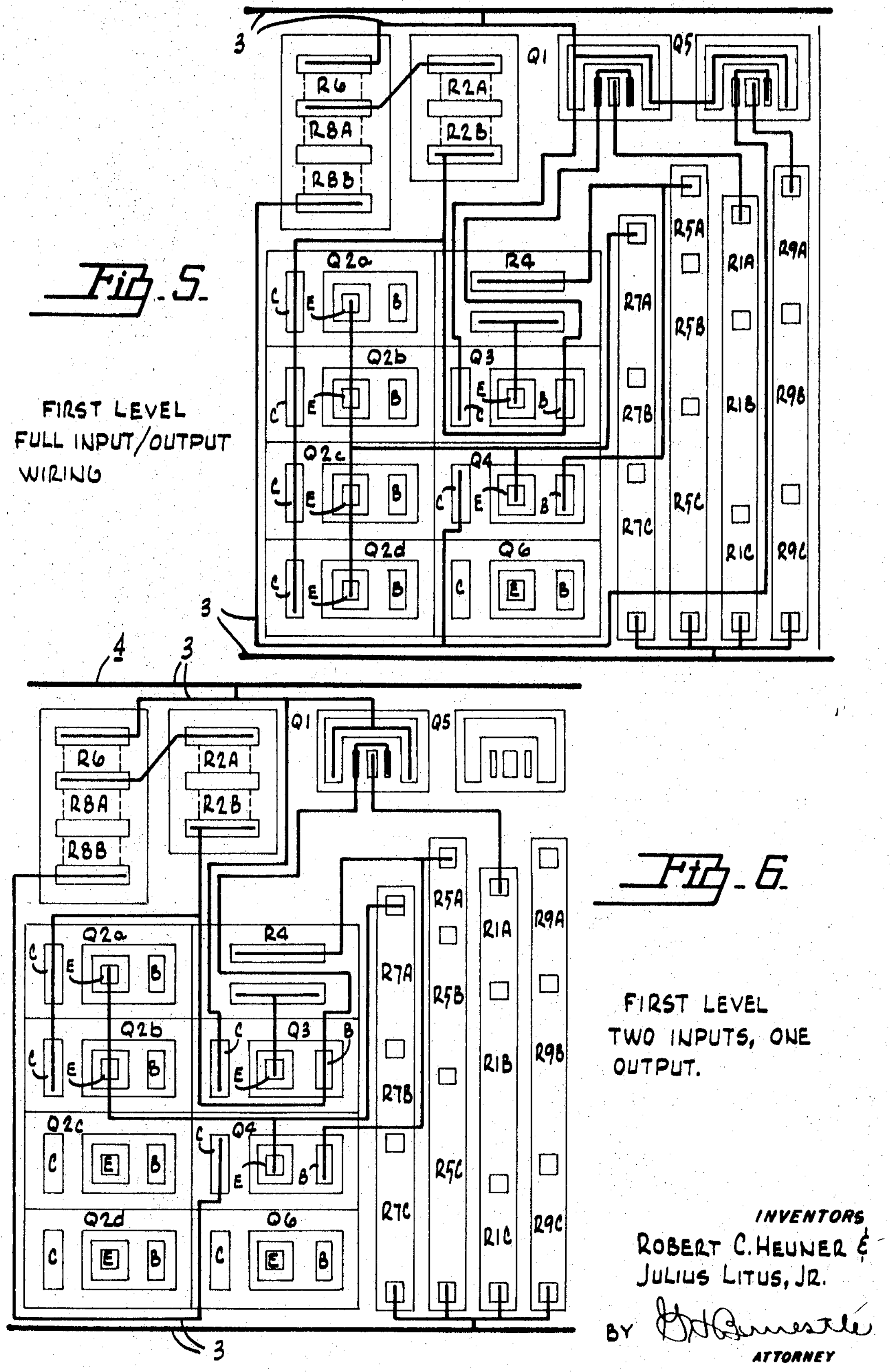
FIG. 5 shows, in stylized fashion, the interconnection wiring required to connect the elements of FIG. 1 to provide the circuit of FIG. 2.
FIG. 6 shows, in stylized fashion, the interconnection wiring arrangement for connecting the elements of FIG. 1 in accordance with a partial realization of the circuit of FIG. 2.

The transistor and resistor elements of the array 1 may be interconnected by a suitably etched deposited aluminum layer to provide a circuit corresponding to any of those shown in FIGS. 2 to 4. For example, the interconnections corresponding to the 0.4 volt logic gate of FIG. 2, will all four inputs and two outputs utilized, is shown in FIG. 5. Since these interconnections are provided by portions of a deposited metallic layer, they must be arranged in such a manner that no cross-overs occur. The interconnection diagram of FIG. 5 meets this requirement for a coplanar wiring arrangement.

Power is supplied to the integrated circuit structure of FIG. 5 by making electrical connections to the ground buss and the $V_{EE}$ buss. Each of these busses is in the form of a metallic strip portion of the deposited aluminum layer 3 disposed on the insulating layer 2.

The interconnection diagram of FIG. 5 shows that the area of the circuit over the transistor Q6 is not used. This area may therefore be utilized for the making of an external connection to the integrated circuit. Since, however, only transistor Q6 is not utilized, the other required external connections to the integrated circuit of FIG. 5 must be provided via peripheral bonding pads (not shown) disposed around the circuit on the semiconductor wafer.

Where only two inputs and one output are required for the particular logic function to be performed, an integrated circuit 4 realizing the 0.4 volt logic gate function may be provided, corresponding to the interconnection diagram shown in FIG. 6. It is seen that in this case unused areas over transistors Q2*c*, Q2*d*, Q5 and Q6 are available for external connection purposes. The manner in which these external connections may be made, for the integrated circuit 4 of FIG. 6, is shown in FIG. 7.

Figure 7:
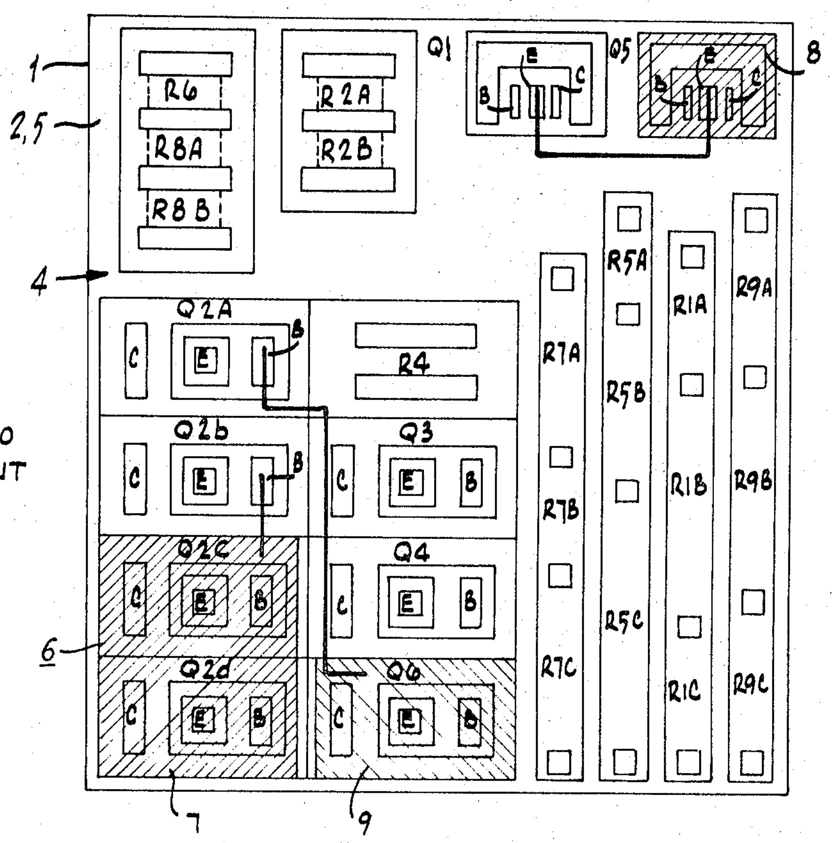
FIG. 7 shows bonding pad locations and interconnections corresponding to the wiring arrangement of FIG. 6.

As shown in FIG. 7, the integrated circuit 4 has a second level silicon dioxide insulating layer 5 overlying (i) the first level metal interconnection layer 3 (not shown for reasons of clarity) and (ii) the first level insulating layer 2. The second level insulating layer 5 has selected holes therein in registration with corresponding holes in the first level insulating layer 2, i.e., the holes exposing the transistor and resistor element contact areas to be utilized for array interconnections.

A metallic aluminum layer 6 is disposed on the second level insulating layer 5. Portions of the aluminum layer 6 cover the unused transistors Q2*c*, Q2*d*, Q5 and Q6 to form bonding pads 7, 8 and 9, respectively, for accepting external connections to the integrated circuit 4. Since the input transistors Q2*c* and Q2*d* (not drawn to scale) are substantially smaller than the other transistors of the circuit, the bonding pad 7 extends over both Q2*c* and Q2*d* to provide sufficient area for conveniently making connection thereto. A portion of the aluminum layer 6 connects the bonding pad 9 to the base of transistor Q2*a*. Similarly, the bonding pad 7 is electrically connected to the base contact area of transistor Q2*b*, and the bonding pad 8 to the emitter contact area of transistor Q1.

Figure 8:
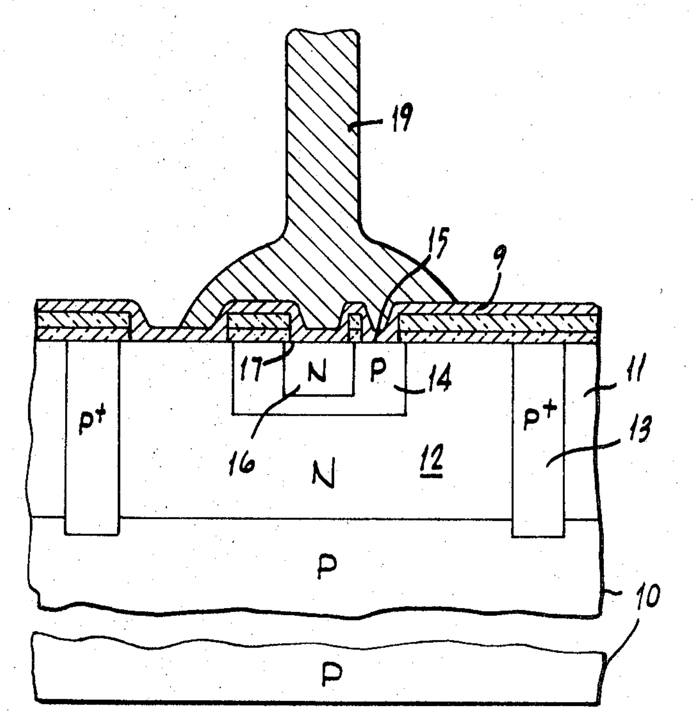
FIG. 8 is a cross-sectional view of one of the bonding pads shown in FIG. 7.

The detailed structure of these bonding pads will be better understood from FIG. 8, which shows a cross-sectional view of the bonding pad 9. There is shown in FIG. 8 the underlying portion of a part of the semiconductor wafer on which the integrated circuit 4 is formed. The wafer comprises a P type substrate 10 having an N type epitaxial layer 11 adjacent one surface thereof.

A portion 12 of the epitaxial layer 11 is surrounded by a diffused P+ ring 13 which, in conjunction with the substrate 10, isolates the layer portion 12 from other parts of the semiconductor wafer. The isolated region 12 serves as the collector of Q6. A P type region 14 is diffused into the collector region 12 to serve as the base region of Q6, and is provided with an associated contact area 15. Similarly, an N-type region 16 is diffused into the base region 14 to form the emitter region of Q6, which is provided with a contact area 17. The bonding pad 9 is seen to comprise an aluminum layer short-circuiting together the emitter, base and collector regions via their corresponding contact areas.

External connection to the bonding pad 9 is made by means of a gold wire 19 which is thermocompression bonded to the bonding pad 9.

By providing bonding pads over the unused transistors in the manner shown in FIG. 7, the need for three of the usually required external bonding pads is eliminated, with a considerable saving in integrated circuit chip area. The remaining connections, for power supply purposes, may be provided by bonding wires to portions of the ground and $V_{EE}$ busses exposed through corresponding holes in the second level insulating layer 5.

Figure 9:
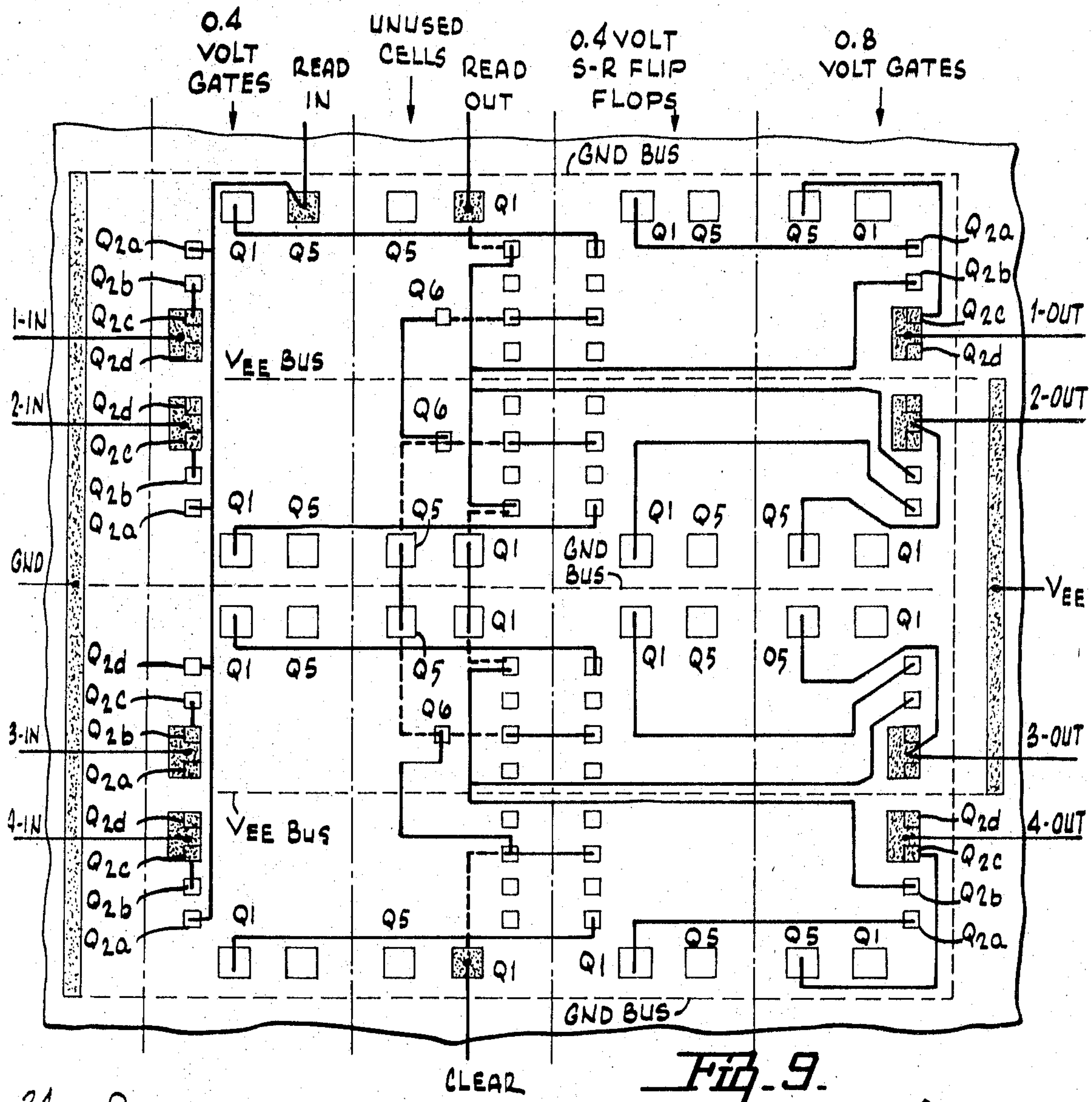
FIG. 9 shows, in stylized fashion, an interconnection wiring diagram for a four-bit gated register.

The saving in integrated circuit chip area which can be realized becomes quite significant when individual integrated circuits, or cells, are interconnected to provide a medium or large scale integrated circuit array. Such an array, for example, is illustrated in FIG. 9, and performs the function of a four-bit gated register. The four-bit register 20 comprises an array of sixteen individual cells. The dot-dash lines indicate the boundaries of the individual cells. The dashed lines indicate first level metallization interconnections, while the solid lines indicate second level metallization interconnections. The darkened rectangular areas indicate bonding pad locations.

The four cells vertically aligned in the left-hand column of the integrated circuit array 20 each comprise a 0.4 volt logic gate having two inputs and one output, each such gate having an interconnection diagram similar to that shown in FIG. 6.

The four cells in the second vertical column from the left of the integrated circuit array 20 are unused for circuit logical functions, but are instead employed to provide needed cross-overs in the wiring arrangement. Each crossover is indicated by the intersection of a dashed (first level metallization) with a solid (second level metallization) line.

The vertically aligned cells in the third column from the left of the integrated circuit array 20 are interconnected as 0.4 volt R-S flip-flops, while the cells of the righthand vertical column of the integrated circuit array are interconnected as 0.8 volt logic gates.

Bonding pads are disposed over various unused input and output transistors, so that all required signal input and output connections can be made without the need for provision of peripheral bonding pads which occupy semiconductor wafer area that could otherwise be employed for the formation of additional active and/or passive circuit elements.

Figure 10:
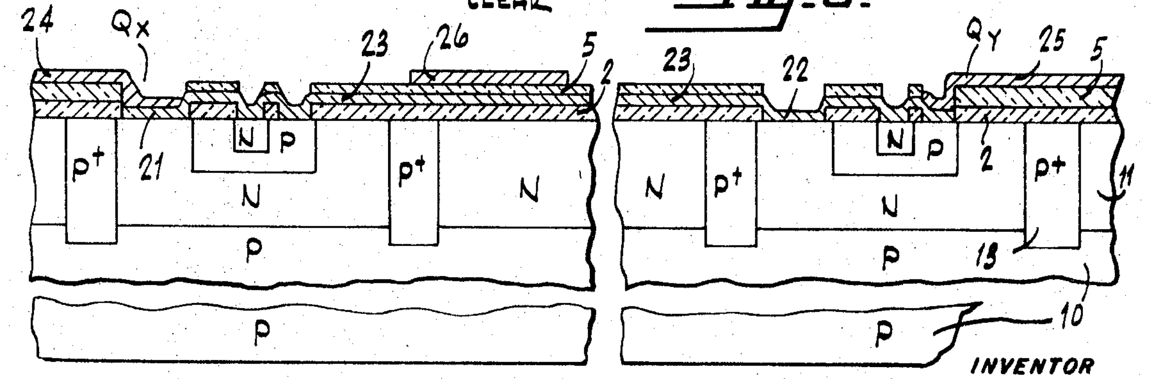
FIG. 10 is a cross-sectional view of one of the crossovers shown in FIG. 9.

The manner in which the unused cells are employed to provide crossovers is illustrated in FIG. 10.

Referring to FIG. 10, there are shown two unused transistors $Q_x$ and $Q_y$ of one of the unused cells corresponding to the second from the left vertical column of integrated circuit array 20. The semiconductor regions of each of these cells correspond to those described for the transistor Q6 discussed in connection with FIG. 8.

Metallized terminal areas 21 and 22 overlie each of the transistors $Q_x$ and $Q_y$. These metallized areas are provided by portions of the first metallization layer 3. The second insulating layer 5 overlies the first metallization layer 3 and has holes therein exposing the metallized areas 21 and 22. The areas 21 and 22 are electrically interconnected by means of a portion 23 of the first metallization layer 3.

One of the crossing metallic leads, comprising a portion of the second metallization layer 6, has end sections 24 and 25 which extend through holes in the second insulating layer 5 to make electrical contact with the terminal areas 21 and 22 respectively, thus providing a direct electrical connection between the end sections 24 and 25.

The overlying crossing lead 26 is disposed on a part of the second insulating layer 5 above the portion 23 of the first metallization layer 3 interconnecting the terminal areas 21 and 22. Thus the lead 26 may cross over the lead having end sections 24 and 25 while being insulated therefrom.

In the foregoing discussion of the provision of bonding pads over unused active area components, and the use of such components for metallization crossovers, no additional masks are required beyond those needed to provide the desired metallization patterns. That is, each of the insulating layers 2 and 5 may be deposited and etched by means of the same or similar masks to provide the openings exposing the contact areas of the transistor and resistor elements of the array.

What is claimed is:

1. An integrated circuit, comprising:

a substrate having regions of semiconductor material forming a predetermined number of semiconductor elements, each element having a given number of contact areas adjacent a major surface of said substrate;

a first insulating layer on said surface, said layer having apertures exposing said contact areas, first metallic layer on said insulating layer, said metallic layer having a plurality of portions providing operative electrical interconnections between only a selected number, less than said predetermined number, of said elements, whereby some of said elements are unselected and have no operative electrical interconnection with the selected elements, a second insulating layer on said metallic layer, said second layer having holes disposed in registration with selected ones of said apertures, and a second metallic layer on said second insulating layer, said second metallic layer having at least one portion overlying at least one unselected semiconductor element, at least one of said metallic layers having a portion for electrically coupling said at least one second metallic layer portion to a contact area of a selected semiconductor element,

2. An integrated circuit according to claim 1, wherein said circuit has at least two unselected elements, said circuit including a cross-over comprising:

a specified portion of said first metallic layer electrically interconnecting a particular contact area of one of the said unselected elements with a particular contact area of the other of said unselected elements;

first and second portions of said second metallic layer electrically connected to respective ones of said particular contact areas, thereby providing an electrical connection between said first and second portions via said first metallic layer, and a third portion of said second metallic layer on said second insulating layer overlying and crossing over said specified portion of said first metallic layer.

3. An integrated circuit according to claim 1, further comprising an outwardly extending terminal lead bonded to said second metallic layer portion.

References Cited

UNITED STATES PATENTS

| | | | |
|---|---|---|---|
| 3,178,804 | 4/1965 | Ullery, Jr. et al. | 317—101A(UX) |
| 3,402,330 | 9/1968 | Archer | 317—235.22(UX) |
| 3,419,765 | 12/1968 | Clark et al. | 317—234 |
| 3,436,611 | 4/1969 | Perry | 317—234 |

DAVID SMITH, Jr., Primary Examiner

U.S. Cl. X.R.

317—234